United States Patent

Shibata et al.

[11] Patent Number: 5,723,902
[45] Date of Patent: Mar. 3, 1998

[54] SURFACE MOUNTING TYPE ELECTRONIC COMPONENT

[75] Inventors: Kazutaka Shibata; Yasunobu Shoji, both of Kyoto, Japan

[73] Assignee: Rohm Co. Ltd., Kyoto, Japan

[21] Appl. No.: 681,967

[22] Filed: Jul. 30, 1996

[30] Foreign Application Priority Data

Jul. 31, 1995 [JP] Japan ................... 7-195561

[51] Int. Cl.$^6$ .................. H01L 23/495; H01L 23/48; H01L 23/52
[52] U.S. Cl. .................. 257/692; 257/694; 257/695; 257/696; 257/666; 438/123
[58] Field of Search .................. 257/692, 666, 257/669, 674, 694, 695, 696, 779; 438/123, 111, 112

[56] References Cited

U.S. PATENT DOCUMENTS 4,777,520  10/1988  Nambu et al. ............... 257/793

FOREIGN PATENT DOCUMENTS 1-227 464  9/1989  Japan ................... 257/692

*Primary Examiner*—Mahshid D. Saadat
*Assistant Examiner*—Jhihan B. Clark
*Attorney, Agent, or Firm*—Michael D. Bednarek; Kilpatrick Stockton LLP

[57] ABSTRACT

A surface mounting type electronic component is provided which includes an electronic element enclosed in a resin package, and a plurality of leads electrically connected to the electronic element. Each of the leads has an inner lead portion inserted in the package and an outer lead portion extending out of the package. The outer lead portion has an end face includes a rounded bottom corner portion continuous with the flat bottom surface, a vertically scored lower portion following the rounded bottom corner portion, and a tear portion above the vertically scored portion.

10 Claims, 9 Drawing Sheets

SURFACE MOUNTING TYPE ELECTRONIC COMPONENT

BACKGROUND OF THE INVENTION

1. Field of the Invention

The present invention relates to a surface mounting type electronic component wherein each of plural leads has an outer lead portion which is bent to have a flat bottom surface for conveniently mounting to a surface of a circuit board.

2. Description of the Related Art

A surface mounting type electronic component such as a semiconductor IC typically comprises an electronic element enclosed in a resin package, and a plurality of leads electrically connected to the electronic element. Each of the leads has an inner lead portion inserted in the package and an outer lead portion extending out of the package. The outer lead portion is bent in a crank form to have a flat horizontal contact portion for contact with a surface of a circuit board. Such an electronic component is disclosed in U.S. Pat. No. 4,777,920 for example.

Normally, the surface mounting type electronic component is mounted on a circuit board by reflow soldering. Specifically, a solder paste is printed at respective terminal pads of the circuit board, and the flat contact portion of each outer lead portion is brought into contact with the printed solder paste at a corresponding terminal pad. In this condition, the circuit board is heated in an heating oven to melt the solder, whereby the melted solder is fluidized and comes into adhering contact with the edge surfaces of the flat contact portion due to surface tension. Thus, upon solidification, the applied solder fixes the outer lead portion (i.e., the electronic component) on the circuit board.

To improve affinity or adhesion of each outer lead portion to the applied solder paste in reflow soldering, it is a common practice to preliminarily plate the outer lead portion with solder while the outer lead portion remains connected to a leadframe. However, since the outer lead portion is later cut off from the leadframe by shearing, the material of the leadframe is inevitably exposed at the end face of the outer lead portion. Thus, the end face of the outer lead portion exhibits a poor affinity or adhesion to the solder paste. As a result, if the length of the flat horizontal contact portion of the outer lead portion is rendered short for realization of size reduction (namely, the mounting density on the circuit board), the mounting strength or stability of the electronic component by reflow soldering becomes lower because the solder fixation at the end face of the outer lead portion is correspondingly significant.

SUMMARY OF THE INVENTION

It is, therefore, an object of the present invention to provide a surface mounting type electronic component wherein the outer lead portion of each lead can be firmly soldered on a circuit board particularly at its end face.

According to one aspect of the present invention, there is provided a surface mounting type electronic component comprising: an electronic element; a plurality of leads electrically connected to the electronic element, each of the leads including an inner lead portion and an outer lead portion, the outer lead portion having a flat bottom surface and an end face; and a package enclosing the electronic component together with the inner lead portion of said each lead; wherein the end face of the outer lead portion of said each lead includes a rounded bottom corner portion continuous with the flat bottom surface.

With the structure described above, the rounded bottom corner portion provides an enough space for collecting a large amount of solder which has been previously applied for reflow soldering while also allowing the collected solder to flow upward smoothly due to surface tension. Thus, upon subsequent solidification of the applied solder, the electronic component can be firmly fixed in place on a circuit board by the solidified solder at the end face of each outer lead portion.

Preferably or normally, the end face of the outer lead portion of said each lead may further include a vertically scored portion following the rounded bottom corner portion. The vertical score lines at the scored portion additionally facilitate upward flow of the collected solder due to capillary action, so that soldering fixation of the electronic component can be even promoted. Further, the end face of the outer lead portion of said each lead may include a tear portion above the vertically scored portion.

The outer lead portion of said each lead may be bent outwardly away from the package. Alternatively, the outer lead portion of said each lead may be bent inwardly toward the package.

Further, the outer lead portion of said each lead may be plated with solder except for the end face.

According to another aspect of the present invention, there is provided a surface mounting type electronic component comprising: an electronic element; a plurality of leads electrically connected to the electronic element, each of the leads including an inner lead portion and an outer lead portion, the outer lead portion having a flat bottom surface and an end face; and a package enclosing the electronic component together with the inner lead portion of said each lead; wherein the end face of the outer lead portion of said each lead includes a vertically scored lower portion adjacent to the flat bottom surface and an upper tear portion above the vertically scored portion.

Other objects, features and advantages of the present invention will become apparent from the following description of the preferred embodiments given with reference to the accompanying drawings.

DETAILED DESCRIPTION OF THE PREFERRED EMBODIMENTS

Figure 1:
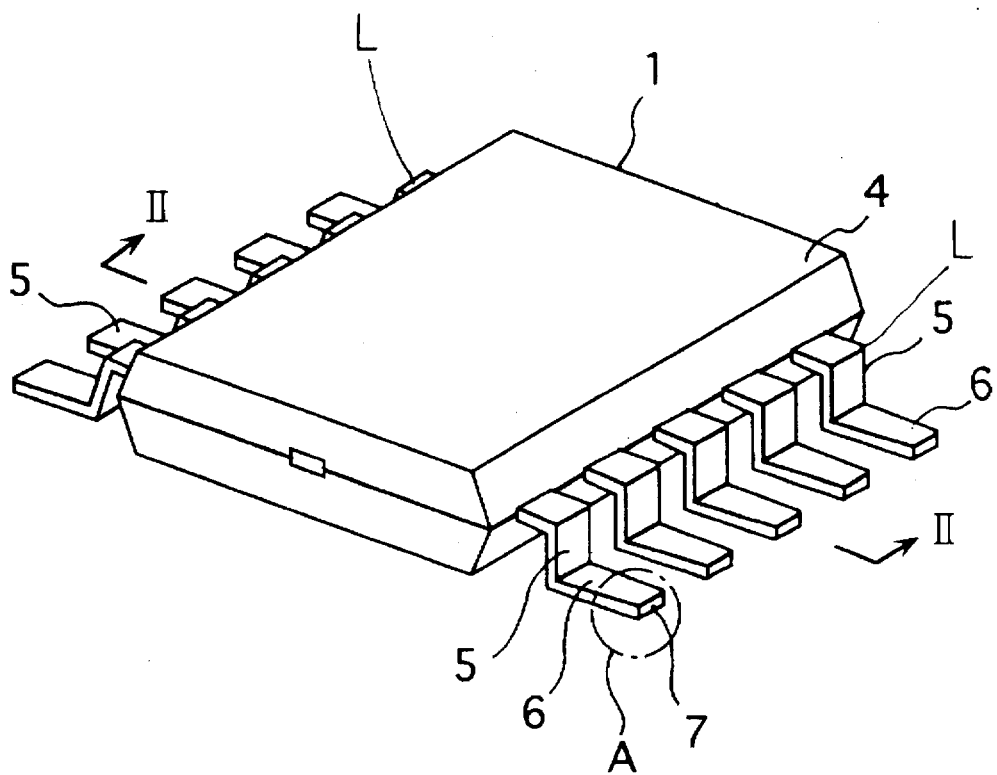
FIG. 1 is a perspective view showing a surface mounting type electronic component embodying the present invention.
Figure 2:
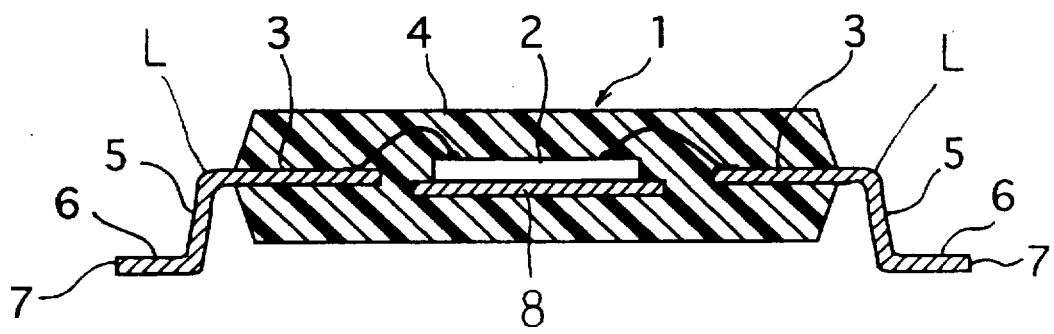
FIG. 2 is a sectional view taken on lines II—II in FIG. 1.

Referring first to FIGS. 1 and 2 of the accompanying drawings, there is illustrated a surface mounting type electronic component 1 embodying the present invention. Typically, the electronic component may be a semiconductor IC device. However, the electronic component may be a diode, transistor, capacitor or resistor.

The electronic component 1 comprises, as an electronic element, a semiconductor chip 2 mounted on a die pad or island 8, and a resin package 4 enclosing the chip 2 together with the die pad 8. The chip 2 is electrically connected to a plurality of leads L on both sides of the resin package 4 by wire bonding.

Each of the leads L has an inner lead portion 3 inserted in the resin package 4, and an outer lead portion 5 extending out of the resin package 4. The outer lead portion 5 is bent like a crank arm and has a flat horizontal mounting portion 6.

Figure 3:
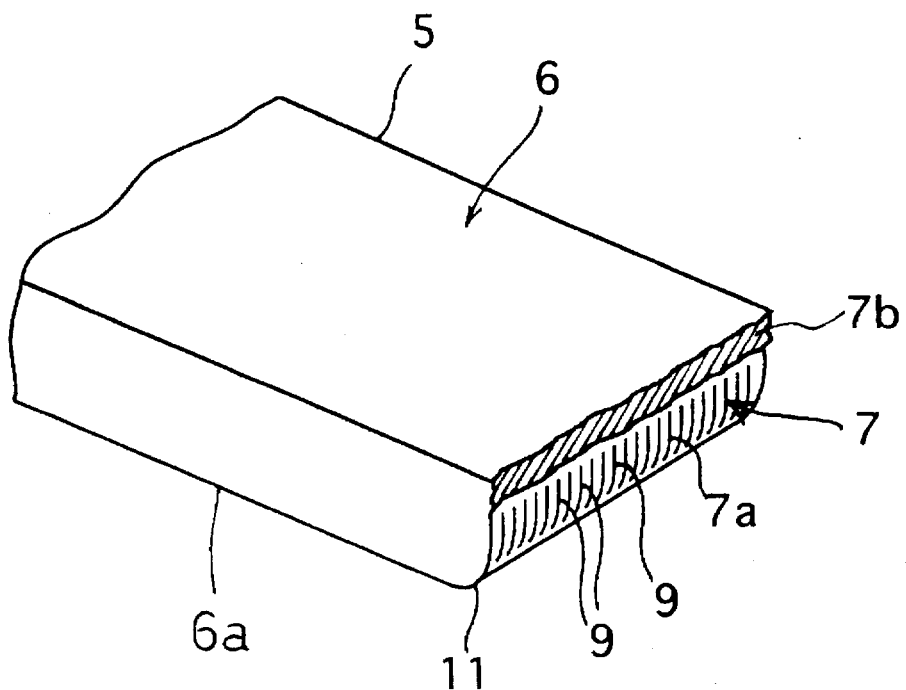
FIG. 3 is an enlarged fragmentary perspective view showing an outer lead portion of the are component indicated by a circle A in FIG. 1.
Figure 4:
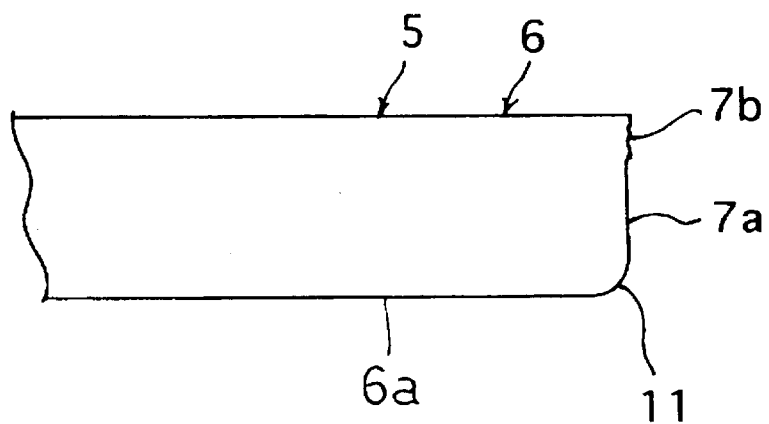
FIG. 4 is an enlarged fragmentary side view showing the outer lead portion of the same component.

As shown in FIGS. 3 and 4, the outer lead portion 5 of each lead L has an end face 7 which is configured to facilitate mounting of the electronic component 1 by fellow soldering. Specifically, the end face 7 includes a rounded bottom corner portion 11 extending from the bottom contact surface 6a of the horizontal mounting portion 6, a vertically scored lower portion 7a extending from the rounded bottom corner portion 11, and an upper tear portion 7b located above the vertically scored lower portion 7a. The vertically scored lower portion 7a includes a multiplicity of vertical score lines 9 which may be very minute. Such a configuration of the end face 7 of the outer lead portion 5 is obtained at the time of cutting the outer lead portion 5 from a leadframe, as described hereinafter.

Figure 5:
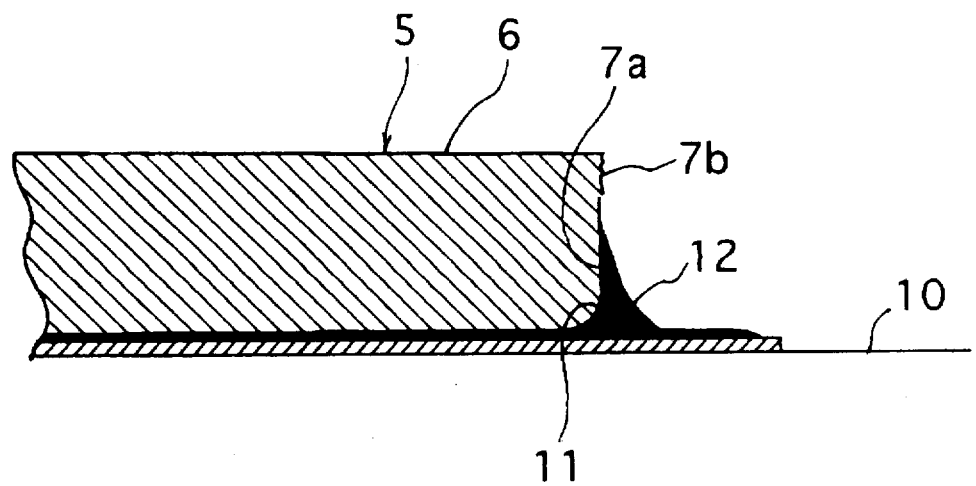
FIG. 5 is an enlarged fragmentary sectional view showing the outer lead portion of the same component as mounted on a circuit board by reflow soldering.
Figure 6:
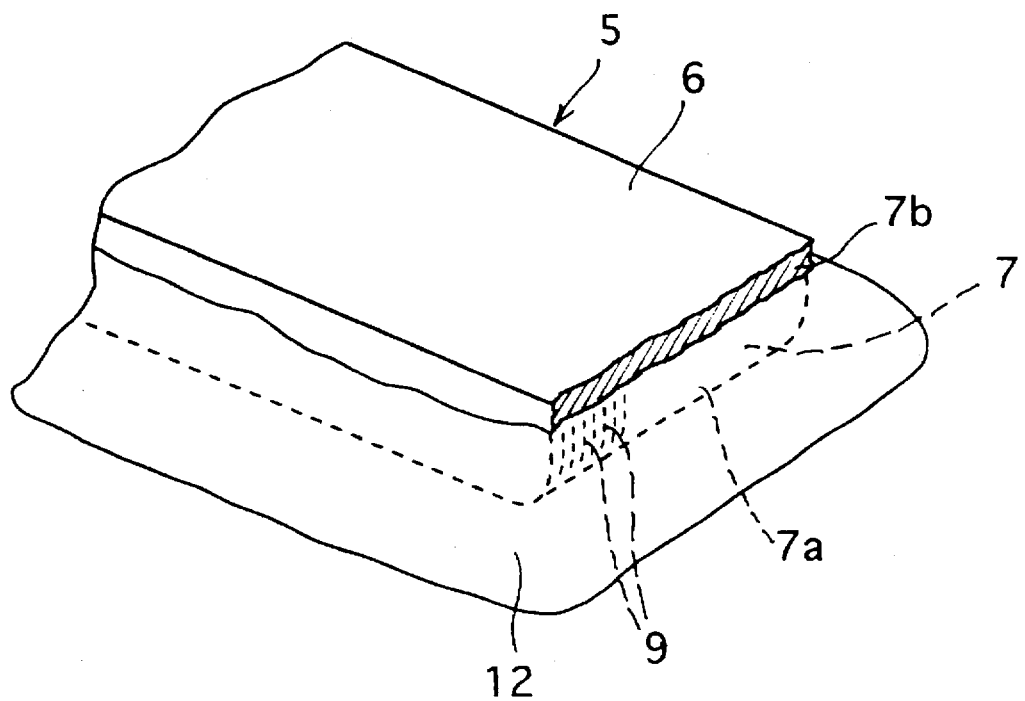
FIG. 6 is an enlarged fragmentary perspective view showing the outer lead portion of the same component as soldered on the circuit board.

The electronic component 1 described above is mounted on a surface of a circuit board 10 by reflow soldering, as shown in FIGS. 5 and 6. More specifically, the outer lead portion 5 of each lead L is first brought into contact with a solder deposit 12 which is previously applied on the circuit board 10, and the solder deposit 12 is caused to melt under heating. At this time, a portion of the melted solder 12 gathers at the bottom corner portion 11 of the end face 7 of the outer lead portion 5 due to surface tension and then flows up along the respective score lines 9 due to capillary action. As a result, the electronic component 1 can be firmly fixed on the circuit board 10 upon solidification of the melted solder 12 even if the length of the flat horizontal portion 6 of the outer lead portion 5. In this way, the bottom corner portion 11 of the end face 7 of the outer lead portion 5 provides a space for collecting a portion of the melted solder 12, whereas the vertical score lines 9 causes upward flow of the melted solder 12 while providing an improved affinity or adhesion to the solidified solder.

The surface mounting type electronic component 1 may be advantageously manufactured in the following manner.

Figure 7:
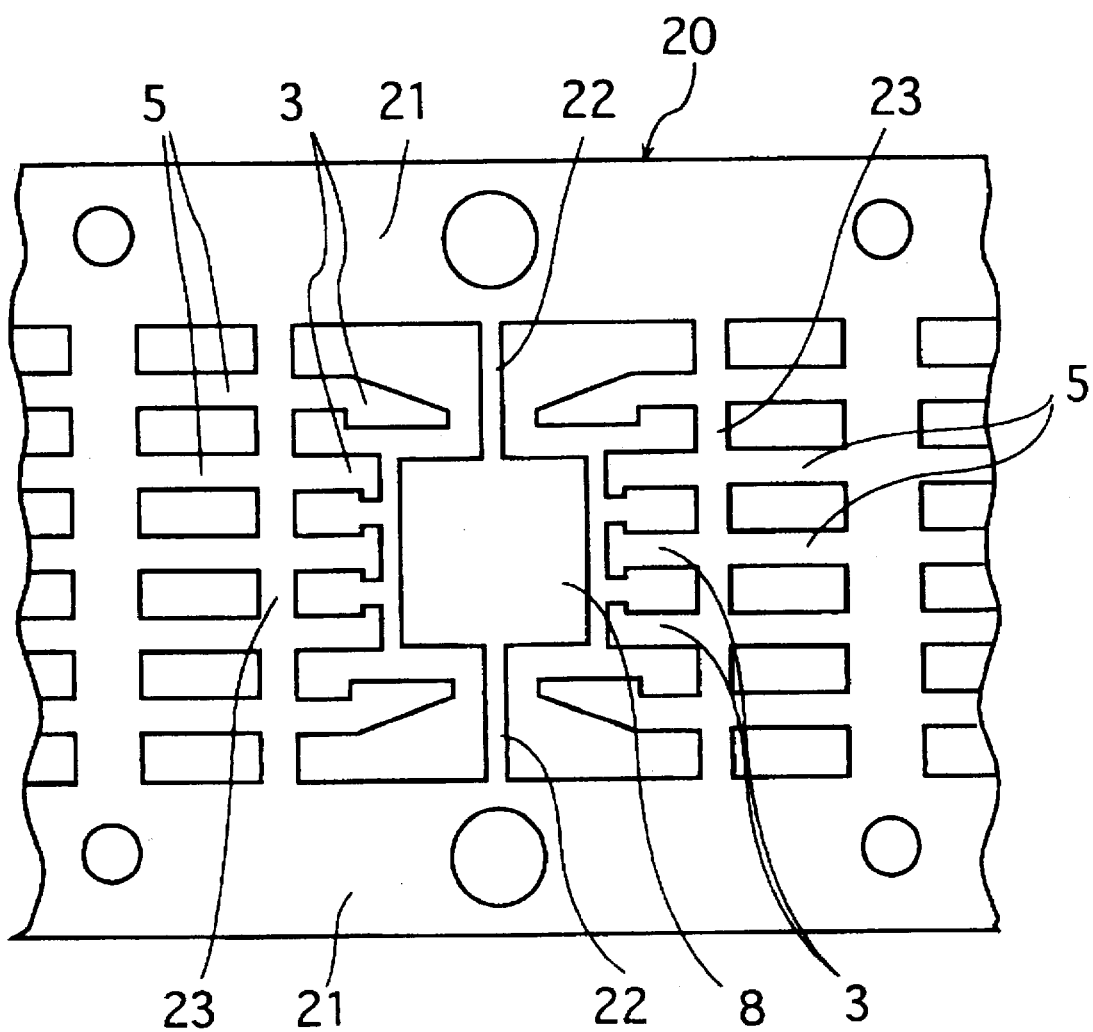
FIGS. 7 through 10 are plan views showing the successive steps of making the electronic component illustrated in FIG. 1.

First, as shown in FIG. 7, a leadframe 20 is prepared which comprises two laterally spaced side bands 21 which is connected together by a plurality of tie bars 23. Between each two adjacent tie bars 23, there is provided a die pad 8 connected to the two side bands 21 by respective support bars 22. A plurality of inner lead portions 3 extend toward the die pad 8 from each tie bar 23, whereas a corresponding number of outer lead portions 5 extend away from the die pad 8 from each tie bar 23 in alignment with the corresponding inner lead portions 3. It should be understood here that though only two tie bars 23 together with its associated die pad 2 and leads are shown in FIG. 7, the leadframe actually includes more tie bars and die pads for making a plurality of identical electronic components.

Figure 8:
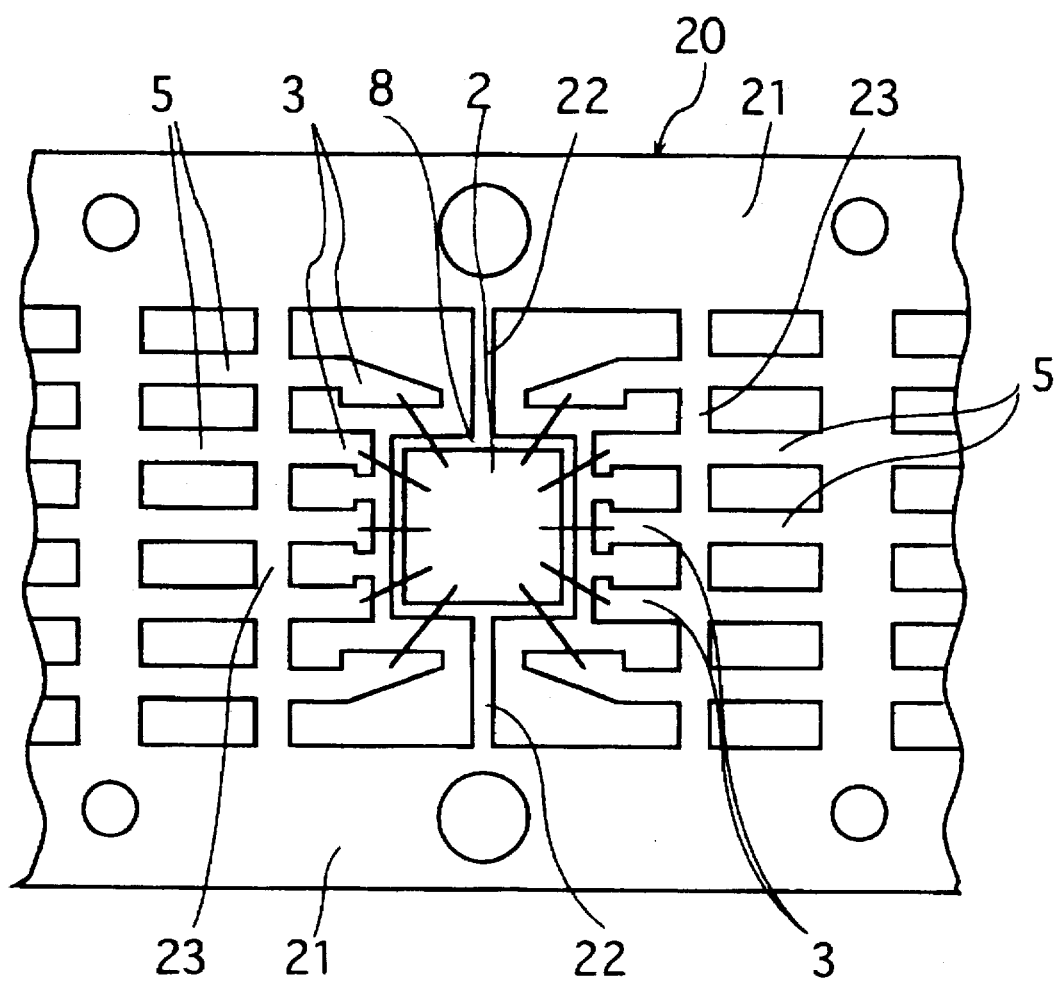

Then, as shown in FIG. 8, a semiconductor chip 2 is bonded on each die pad 8 and electrically connected to the corresponding inner lead portions 3 by wire bonding.

Figure 9:
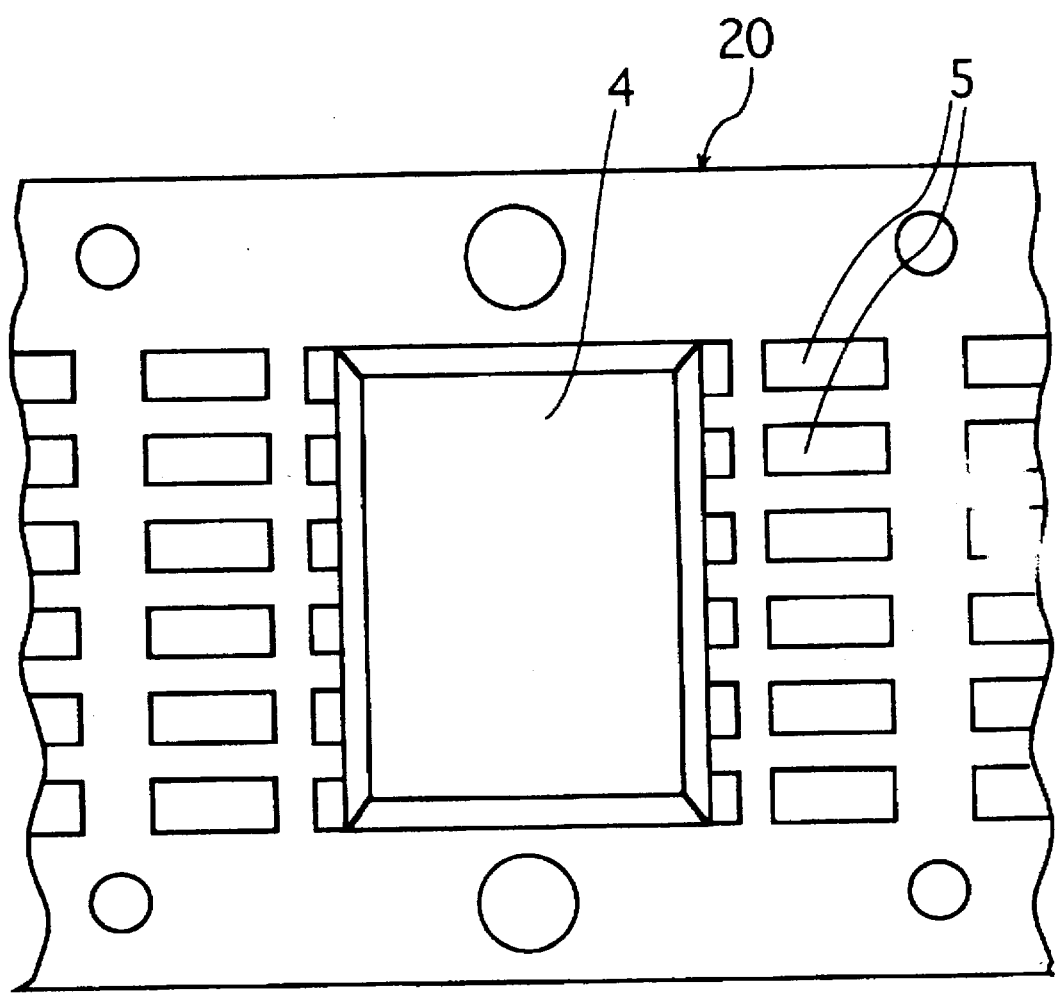

Then, as shown in FIG. 9, a resin package 4 is formed in situ by transfer molding to enclose each semiconductor chip 2 together with the corresponding inner lead portions 3.

Then, the leadframe 20 on which each resin package 4 is formed is subjected to a solder plating step. Specifically, the leadframe 20 together with the resin package 4 is immersed entirely in a solder plating bath. As a result, exposed surfaces of the leadframe 20 are plated or coated with solder, whereas the resin package 4 remains non-plated due to far lower affinity with solder.

Figure 10:
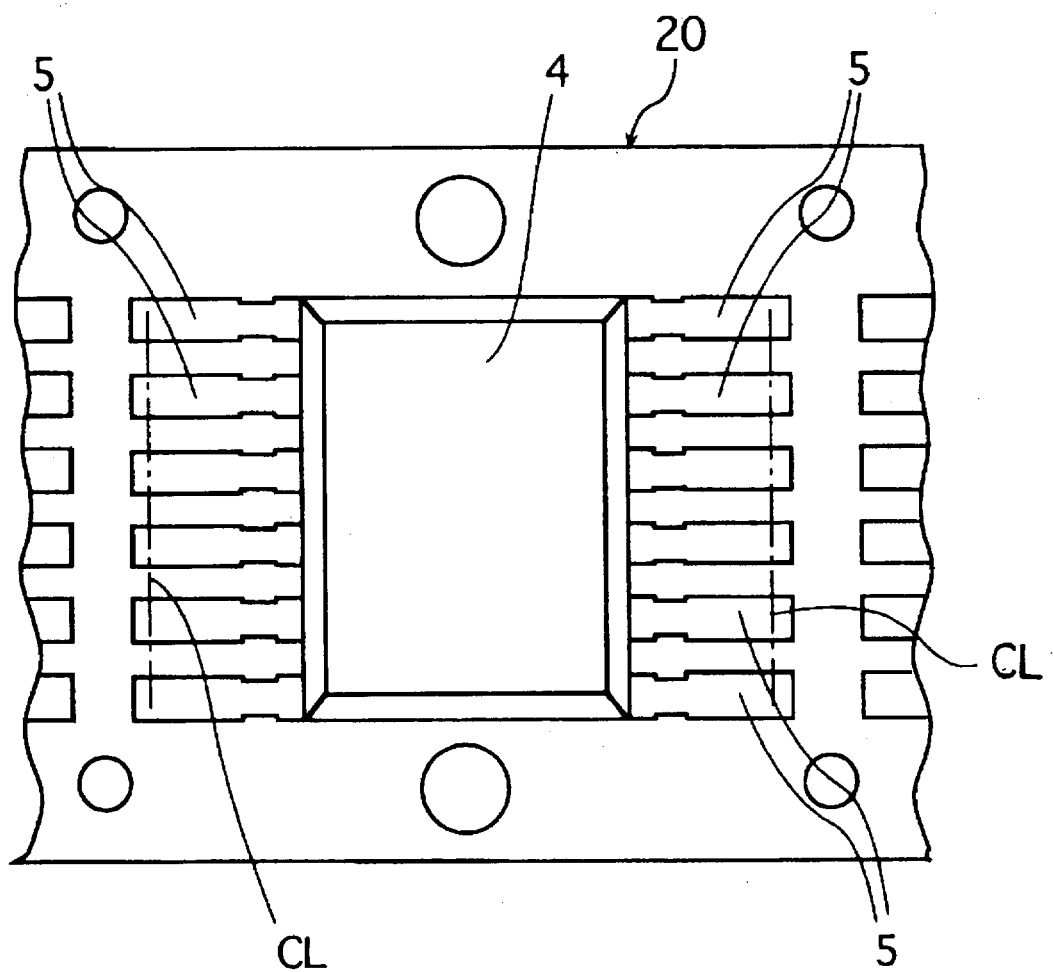

Then, as shown in FIG. 10, unnecessary portions of the tie bars 23 are removed by shearing, and the outer lead portions 5 are cut off the leadframe 20 by shearing along lines CL.

Finally, each outer lead portion 5 is bent into a crank arm form (see FIG. 1) to provide a product (FIGS. 1 through 4).

Figure 11:
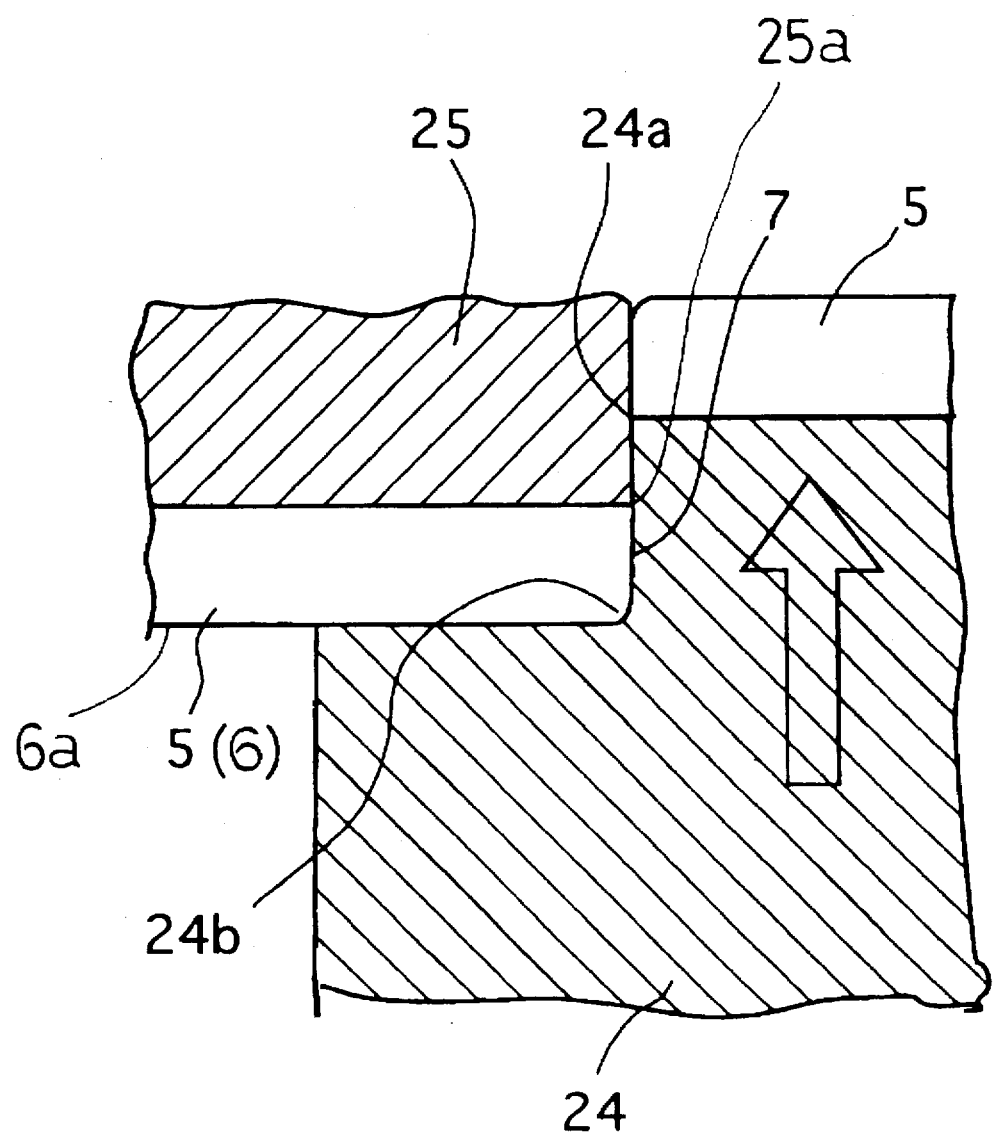
FIG. 11 is a fragmentary sectional view showing a shearing device used for lead cutting.
Figure 12:
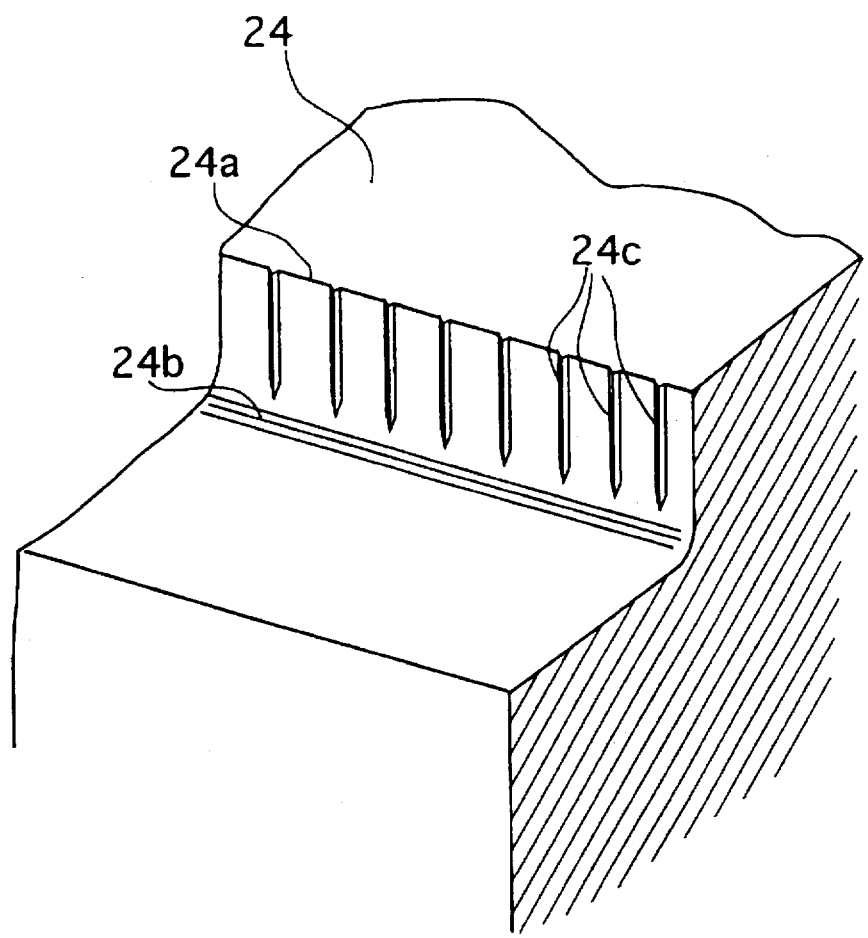
FIG. 12 is a perspective view showing a part of the same shearing device.

In the above-described process, the cutting of the outer lead portions 5 off the leadframe 20 may be advantageously performed by using such a shearing device as shown in FIGS. 11 and 12 for example. Specifically, the shearing device includes a lower blade member 24 and an upper blade member 25. The lower blade member 22, which is stepped, has a cutting edge 24a and a rounded corner 24b at the point of step. Further, the lower blade member 24 has a plurality of V-shaped projections 24c (see FIG. 12) extending from the cutting edge 24a toward the rounded corner 24b.

The upper blade member 25 also has a cutting edge 25a and a plurality of V-shaped grooves (not shown) in complementary relation to the V-shaped projections 24c of the lower blade member 24.

By the use of the shearing device shown FIGS. 11 and 12, shearing of each outer lead portion 5 proceeds as follows. When the cutting edge 24a of the lower blade member 24 first comes into engagement with the outer lead portion 5, a portion of the metal material (of which the leadframe 20 is made) is dragged in by the cutting edge 24a, consequently forming a rounded bottom corner portion 11 (see FIG. 3). Upon further advance of the lower blade member 24, the V-shaped projections 24c of the lower blade member 24 abrasively form a plurality of score lines 9 (i.e., a lower vertically scored portion 7a) by vertical movement of the projections 24c. In the final stage of shearing, a tearing action predominates, so that an upper tear portion 7b is formed at the cut end face 7 of the outer lead portion 5. At the completion of shearing, the rounded bottom corner portion 11 coincides with and/or added shaped by the rounded corner 24b of the lower blade member 24.

As previously described, the leadframe 20 as a whole is subjected to solder plating before cutting each outer lead portion 5 off the leadframe. Thus, at the time of mounting the electronic component 1 on the circuit board 10 (FIG. 5) by reflow soldering, the applied solder 12 exhibits a good affinity or adhesion to all surfaces of the solder-plated outer lead portion 5 except for the end face 7 which is a subsequently cut face.

However, the rounded bottom corner portion 11 of the cut end face 7 of each outer lead portion 5 provides an enough space for collecting a relatively large amount of solder 12 which is allowed to flow up along the vertically scored lower portion 7a of the cut end face 7 particularly at the vertical score lines 9. As a result, the combination of the rounded bottom corner portion 11 and the vertically scored portion 7a compensates for a solder-affinity reduction which is caused by the absence of a plated solder layer, thereby providing a good fixation. Such an advantage is particularly significant when the length of the flat horizontal portion 6 of the outer lead portion 5 is reduced.

According to the embodiment described above, the vertically scored lower portion 7a of the end face 7 of the outer lead portion 5 is formed by vertical movement of the lower blade member 24 which has a plurality of V-shaped projections 24c at the cutting edge 24a. However, if the cutting edge 24a is irregularly configured (as viewed microscopically), such projections need not be positively provided.

Figure 13:
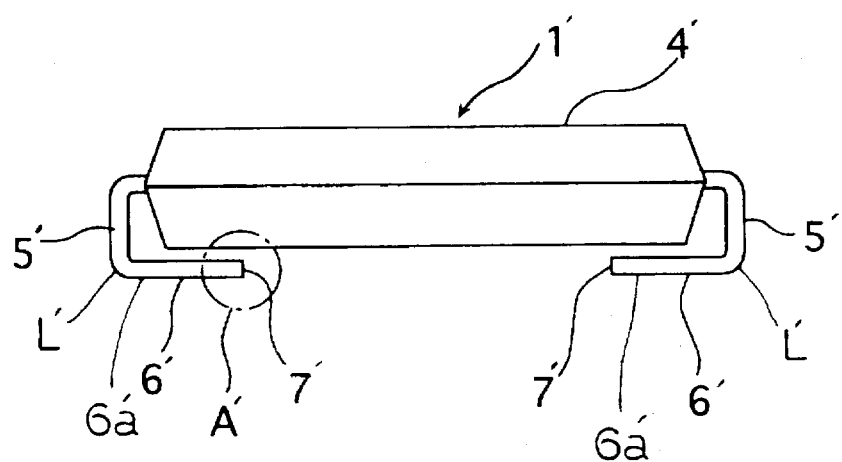
FIG. 13 is a side view showing another surface mounting type electronic component embodying the present invention.

FIG. 13 shows another surface mounting type electronic component embodying the present invention. The electronic component of this embodiment is similar to that of the foregoing embodiment. Thus, the corresponding elements of the electronic component are designated by the same reference numerals with a prime (') as those used in FIGS. 1 through 4.

The electronic component 1' according to the embodiment shown in FIG. 13 includes a plurality of leads L' each having an outer lead portion 5' which is bent inwardly toward the underside of the resin package 4' to provide a flat horizontal portion 6'. Like the foregoing embodiment, the flat horizontal portion 6' has an end face 7' (see the circle A') which is so configured as shown in FIGS. 3 and 4. Due to the inward bending of the outer lead portion 5', the embodiment of FIG. 13 is advantageous in that the overall size of the electronic component 1' can be reduced.

The present invention being thus described, it is obvious that the same may be varied in many ways. Such variations are not to be regarded as a departure from the spirit and scope of the invention, and all such variations as would be obvious to those skilled in the art are intended to be included within the scope of the following claims.

We claim:

1. A surface mounting type electronic component comprising:

an electronic element;

a plurality of leads electrically connected to the electronic element, each of the leads including an inner lead portion and an outer lead portion, the outer lead portion having a flat bottom surface and an end face; and a package enclosing the electronic component together with the inner lead portion of said each lead;

wherein the end face of the outer lead portion of said each lead includes a rounded bottom corner portion continuous with the flat bottom surface.

2. The electronic component according to claim 1, wherein the end face of the outer lead portion of said each lead further includes a vertically score a portion following the rounded bottom corner portion.

3. The electronic component according to claim 2, wherein the end face of the outer lead portion of said each lead further includes a tear portion above the vertically scored portion.

4. The electronic component according to claim 1, wherein the outer lead portion of said each lead is bent outwardly away from the package.

5. The electronic component according to claim 1, wherein the outer lead portion of said each lead is bent inwardly toward the package.

6. The electronic component according to claim 1, wherein the outer lead portion of said each lead is plated with solder except for the end face.

7. A surface mounting type electronic component comprising:

an electronic element;

a plurality of leads electrically connected to the electronic element, each of the leads including an inner lead portion and an outer lead portion, the outer lead portion having a flat bottom surface and an end face; and a package enclosing the electronic component together with the inner lead portion of said each lead;

wherein the end face of the outer lead portion of said each lead includes a vertically scored lower portion adjacent to the flat bottom surface and an upper tear portion above the vertically scored portion.

8. The electronic component according to claim 7, wherein the outer lead portion of said each lead is bent outwardly away from the package.

9. The electronic component according to claim 7, wherein the outer lead portion of said each lead is bent inwardly toward the package.

10. The electronic component according to claim 7, wherein the outer lead portion of said each lead is plated with solder except for the end face.

* * * * *